(12) United States Patent
Harber et al.

(10) Patent No.: US 8,897,905 B2
(45) Date of Patent: Nov. 25, 2014

(54) MEDIA VOLUME CONTROL SYSTEM

(75) Inventors: Dustin Harber, San Ramon, CA (US);
Kentaro Oguchi, Menlo Park, CA (US)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 149 days.

(21) Appl. No.: 13/269,102

(22) Filed: Oct. 7, 2011

(65) Prior Publication Data

US 2013/0090751 A1    Apr. 11, 2013

(51) Int. Cl.
*B60Q 5/00* (2006.01)
*H03G 3/30* (2006.01)
*G06F 17/00* (2006.01)

(52) U.S. Cl.
CPC ........... *H03G 3/3005* (2013.01); *H03G 3/3089* (2013.01)
USPC ............................................ 700/94; 382/104

(58) Field of Classification Search
CPC ...... B60N 2/0276; B60Q 9/008; B60Q 1/143; B60Q 2300/312; G06K 9/00791; B60R 2300/105; B60W 2550/12
USPC .......................................................... 382/104
See application file for complete search history.

(56) References Cited

U.S. PATENT DOCUMENTS

| 5,027,432 | A | 6/1991 | Skala et al. |
| 6,188,315 | B1 * | 2/2001 | Herbert et al. ............... 340/438 |
| 6,349,246 | B1 * | 2/2002 | Smith et al. ...................... 701/1 |
| 6,768,422 | B2 * | 7/2004 | Schofield et al. ............ 340/602 |
| 7,317,406 | B2 * | 1/2008 | Wolterman ................... 340/917 |
| 7,394,906 | B2 | 7/2008 | Jun |
| 7,444,311 | B2 * | 10/2008 | Engstrom et al. ............... 706/20 |
| 8,000,480 | B2 | 8/2011 | Mollon |
| 2003/0125855 | A1 * | 7/2003 | Breed et al. ..................... 701/36 |
| 2004/0016870 | A1 * | 1/2004 | Pawlicki et al. ........... 250/208.1 |
| 2004/0209594 | A1 * | 10/2004 | Naboulsi .................... 455/404.1 |
| 2004/0252027 | A1 * | 12/2004 | Torkkola et al. .............. 340/576 |
| 2007/0041552 | A1 * | 2/2007 | Moscato .................. 379/214.01 |
| 2007/0047809 | A1 * | 3/2007 | Sasaki .......................... 382/170 |
| 2008/0136609 | A1 * | 6/2008 | Nakatani et al. ........... 340/425.5 |
| 2011/0093165 | A1 * | 4/2011 | Miller et al. .................... 701/36 |

* cited by examiner

*Primary Examiner* — Curtis Kuntz
*Assistant Examiner* — Thomas Maung
(74) *Attorney, Agent, or Firm* — Patent Law Works LLP

(57) ABSTRACT

A system and method for regulating media volume is disclosed. The system comprises a prediction engine and a regulation module. The prediction engine collects sensor data and scene category data. The scene category data includes data describing an environment in which the media volume is regulated. The prediction engine predicts a workload for a user based at least in part on the scene category data and the sensor data and generates a predicted workload value for the predicted workload. The regulation module adjusts the media volume based at least in part on the predicted workload value.

20 Claims, 7 Drawing Sheets

MEDIA VOLUME CONTROL SYSTEM

BACKGROUND

The specification relates to media control systems. In particular, the specification relates to a system and method for regulating in-vehicle media volume.

It is a common phenomenon that a driver of an automobile listens to media content such as music, podcasts, radio, etc., while driving a vehicle. Frequently, the driver's attention is focused on the media content instead of driving the automobile. For example, the driver may manually adjust the media volume and be distracted, thereby causing accidents in an emergent situation such as an animal suddenly crossing the road. It is therefore desirable to implement a volume control system that controls the media volume automatically to reduce distractions for a driver. However, existing systems for volume control have been proven deficient and have numerous problems.

First, existing automobile-based volume control systems only consider a single factor when controlling the in-vehicle media volume. For example, existing automobile-based volume control systems consider the velocity of a vehicle and control the media volume based on the velocity. These existing systems ignore other factors. For example, they ignore environmental factors (e.g., foggy weather, road traffic conditions, etc.) that might cause a driver to lower the media volume manually in order to focus their attention on driving the automobile.

Second, existing automobile-based volume control systems do not provide functionality for reducing distractions for a driver. For example, existing automobile-based volume control systems may adjust the media volume based on a velocity of a vehicle so that a ratio between a level of the media volume and noise level is constant. Because the noise level is proportional to the velocity, the existing automobile-based volume control systems increase the level of the media volume when the velocity increases and reduce the level of the media volume when the velocity decreases. However, these existing systems fail to consider reducing distractions for a driver when making a decision to increase or decrease the level of the media volume.

SUMMARY OF THE INVENTION

The specification overcomes the deficiencies and limitations of the prior art at least in part by providing a system and method for regulating media volume. The system comprises a prediction engine and a regulation module. The prediction engine collects sensor data and scene category data. The scene category data includes data describing an environment in which the media volume is regulated. The prediction engine predicts a workload for a user based at least in part on the scene category data and the sensor data and generates a predicted workload value for the predicted workload. The regulation module adjusts the media volume based at least in part on the predicted workload value.

BRIEF DESCRIPTION OF THE DRAWINGS

The specification is illustrated by way of example, and not by way of limitation in the figures of the accompanying drawings in which like reference numerals are used to refer to similar elements.

DETAILED DESCRIPTION OF THE PREFERRED EMBODIMENTS

Figure 1:
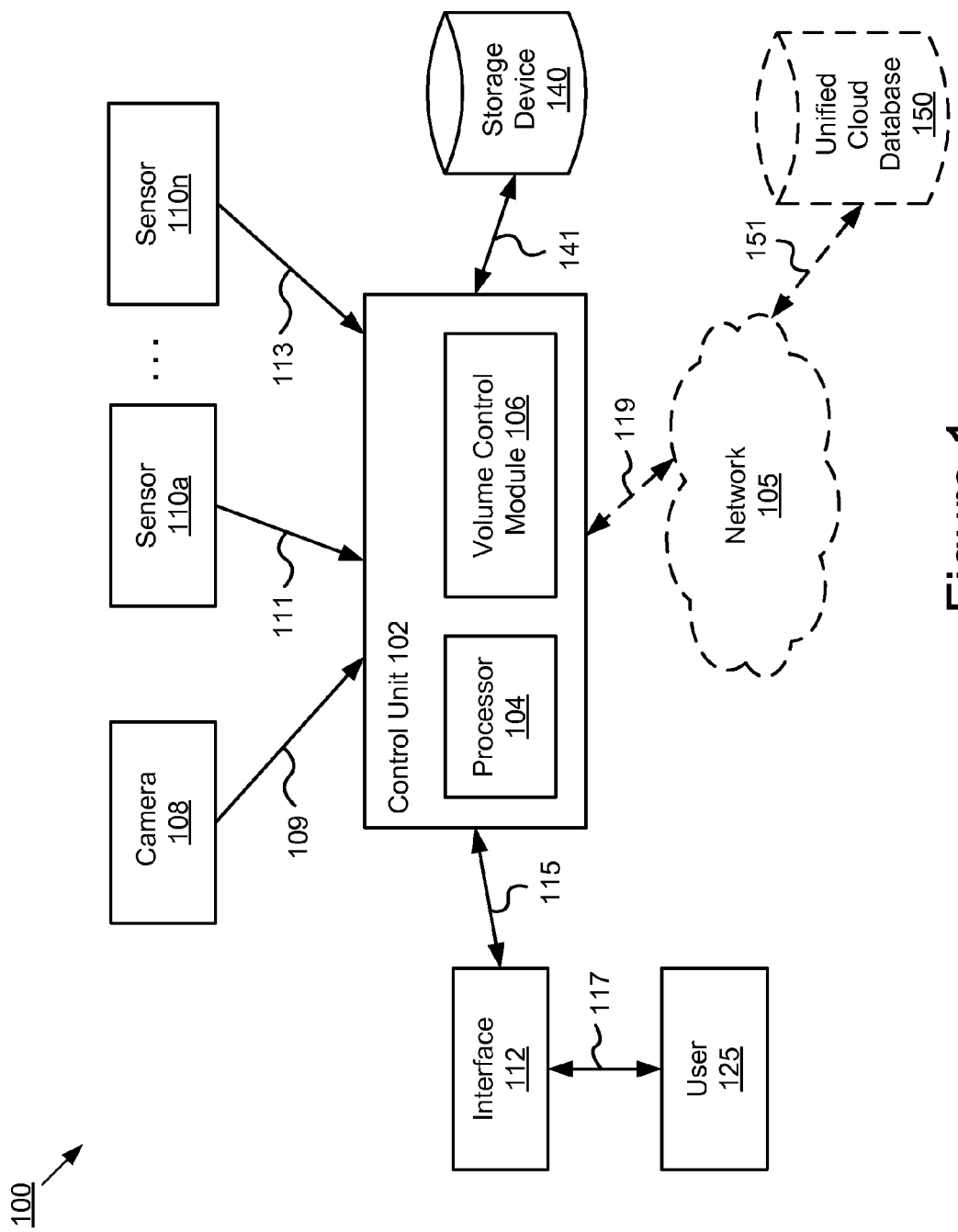
FIG. 1 is a high-level block diagram illustrating a system for regulating media volume according to one embodiment.

A system and method for regulating media volume is described below. In the following description, for purposes of explanation, numerous specific details are set forth in order to provide a thorough understanding of the specification. It will be apparent, however, to one skilled in the art that the embodiments can be practiced without these specific details. In other instances, structures and devices are shown in block diagram form in order to avoid obscuring the specification. For example, the specification is described in one embodiment below with reference to user interfaces and particular hardware. However, the description applies to any type of computing device that can receive data and commands, and any peripheral devices providing services.

Reference in the specification to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The specification also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, compact disc read-only memories (CD-ROMs), magnetic disks, read-only memories (ROMs), random access memories (RAMs), erasable programmable read-only memories (EPROMs), electrically erasable programmable read-only memories (EEPROMs), magnetic or optical cards, flash memories including universal serial bus (USB) keys with non-volatile memory or any type of media suitable for storing electronic instructions, each coupled to a computer system bus.

Some embodiments can take the form of an entirely hardware embodiment, an entirely software embodiment or an embodiment containing both hardware and software elements. A preferred embodiment is implemented in software, which includes but is not limited to firmware, resident software, microcode, etc.

Furthermore, some embodiments can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the specification is not described with reference to any particular programming language. It will be appreciated that a variety of programming languages may be used to implement the teachings of the various embodiments as described herein.

System Overview

FIG. 1 illustrates a block diagram of a system 100 for regulating media volume according to one embodiment. The illustrated system 100 includes a control unit 102, a camera 108, sensors 110a and 110n (referred to individually or collectively as sensor 110), an interface 112, a user 125 and a storage device 140. Although only two sensors 110a and 110n are illustrated, one skilled in the art will recognize that any number of sensors 110 are available. Furthermore, while only one control unit 102, one camera 108, one interface 112, one user 125 and one storage device 140 are depicted in FIG. 1, the system 100 could include one or more control units 102, one or more cameras 108, one or more interfaces 112, one or more users 125 and one or more storage devices 140. One skilled in the art will also appreciate that the system 100 may include other entities not shown in FIG. 1 such as a speaker, a display device, an input device, etc.

In the illustrated embodiment, the camera 108 is communicatively coupled to the control unit 102 via signal line 109. The senor 110a is communicatively coupled to the control unit 102 via signal line 111. The senor 110n is communicatively coupled to the control unit 102 via signal line 113. The user 125 interacts with the interface 112 via signal line 117. The interface 112 is communicatively coupled to the control unit 102 via signal line 115. The storage device 140 is communicatively coupled to the control unit 102 via signal line 141.

In the illustrated embodiment, the system 100 further comprises a network 105 and a unified cloud database 150. The network 105 and the unified cloud database 150 are depicted in dashed lines to indicate that they are optional features of the system 100. The control unit 102 is communicatively coupled to the network 105 via signal line 119. The unified cloud database 150 is communicatively coupled to the network 105 via signal line 151.

The control unit 102 is any processor-based computing device. For example, the control unit 102 is an electronic control unit ("ECU") implemented in a vehicle. In one embodiment, the control unit 102 is implemented using a single integrated circuit such as a system-on-chip (SOC). In one embodiment, the control unit 102 receives one or more images from the camera 108 and one or more sensor signals from the sensors 110. The control unit 102 processes the one or more images and the one or more sensor signals. The control unit 102 regulates media volume in a vehicle based at least in part on one or more processing results. The control unit 102 comprises, among other things, a processor 104 and a volume control module 106. In one embodiment, the control unit 102 includes other components conventional to a control unit such as a memory (not pictured) and an I/O interface (not pictured).

The processor 104 comprises an arithmetic logic unit, a microprocessor, a general purpose controller or some other processor array to perform computations, retrieve data stored on the storage device 140, etc. Processor 104 processes data signals and may comprise various computing architectures including a complex instruction set computer (CISC) architecture, a reduced instruction set computer (RISC) architecture, or an architecture implementing a combination of instruction sets. Although only a single processor is shown in FIG. 1, multiple processors may be included. The processing capability may be limited to supporting the display of images and the capture and transmission of images. The processing capability might be enough to perform more complex tasks, including various types of feature extraction and sampling. It will be obvious to one skilled in the art that other processors, operating systems, sensors, displays and physical configurations are possible.

The volume control module 106 is code and routines for controlling media volume. For example, the volume control module 106 is a volume controller that regulates media volume in a vehicle. Media volume is a volume at which media content is played. Media content, as used herein, includes any type of content. In one embodiment, the media content is audio content (such as a song). In another embodiment, the media content is audio-video content (such as a movie). For example, the media content includes one or more of music, a podcast, an audio news program, an audio book, movies, television shows, user-generated content such as amateur generated videos that are hosted by a video hosting site, etc.

In one embodiment, the volume control module 106 includes code and routines stored in an on-chip storage of the processor 104. In another embodiment, the volume control module 106 is implemented using hardware such as a field-programmable gate array (FPGA) or an application-specific integrated circuit (ASIC). In yet another embodiment, the volume control module 106 is implemented using a combination of hardware and software.

In one embodiment, the volume control module 106 receives one or more images from the camera 108. The volume control module 106 processes the one or more images and generates scene category data based at least in part on the one or more images. The scene category data is data describing an environment in which media volume is regulated. For example, the scene category data includes data describing a scene surrounding a vehicle in which the media volume is controlled. A scene is an environment external to a vehicle. For example, a scene is one of a forest scene, a suburban scene, an urban scene and a freeway scene, etc. The scene category data is described below in more detail with reference to FIG. 2.

In another embodiment, the volume control module 106 receives one or more sensor signals from one or more sensors 110. The volume control module 106 processes the one or more sensor signals and generates sensor data based at least in part on the one or more sensor signals. The sensor data is data associated with one or more sensors 110. For example, the sensor data includes data describing a temperature measured by a temperature-sensitive sensor 110 (e.g., a thermometer or a thermostat). The sensor data is described below in more detail with reference to FIG. 2.

The volume control module 106 predicts a workload for a user based at least in part on the scene category data and the sensor data and generates a predicted workload value for the predicted workload. A workload is an amount of work required to perform a task. For example, a workload is an amount of work required to drive a vehicle in an environment. The volume control module 106 adjusts the media volume based at least in part on the predicted workload value. The volume control module 106 is described below in more detail with reference to FIG. 2.

The camera 108 is an optical device for recording images. For example, the camera 108 takes pictures of roads, traffic lights, vehicles, pedestrians crossing the road, etc., external to a vehicle as the vehicle is driven down a road. In one embodiment, the camera 108 captures images and stores the images in the storage device 140. In one embodiment, the camera 108 is mounted in the front of a vehicle. In other embodiments, the camera 108 is mounted on other portions of the vehicle. In one embodiment, the camera 108 is configured to capture a video including successive frames that describe an environment surrounding a road when a driver is driving a vehicle on the road. The camera 108 sends the images to the volume control module 106.

The sensor 110 is any type of conventional sensor configured to collect any type of data. For example, the sensor 110 is one of the following: a light detection and ranging (LIDAR) sensor; an infrared detector; a motion detector; a thermostat; and a sound detector, etc. Persons having ordinary skill in the art will recognize that other types of sensors are possible. In one embodiment, the sensor 110 measures a condition related to a vehicle and generates a sensor signal describing the condition. For example, the sensor 110 measures one of a steering angle, a brake angle, a velocity, an acceleration and/or deceleration of a vehicle, a temperature inside a vehicle, whether fog lights are on and whether windshield wipers are activated, etc. The sensor 110 generates a sensor signal describing the measurement. In another embodiment, the sensor 110 measures a condition in an environment that is external to the vehicle and generates a sensor signal describing the measurement. For example, the sensor 110 measures a percentage of humidity in an environment and generates a sensor signal describing the measurement. The sensor 110 sends the sensor signal to the volume control module 106.

In one embodiment, the system 100 includes a combination of different types of sensors 110. For example, the system 100 includes a first sensor 110 for monitoring a steering angle of a steering device in a vehicle, a second sensor 110 for monitoring a velocity of the vehicle and a third sensor 110 for monitoring a brake angle of a brake device in the vehicle.

The interface 112 is a device configured to handle communications between the user 125 and the control unit 102. For example, the interface 112 includes one or more of an in-vehicle touch screen for receiving inputs from the user 125 and a microphone for capturing voice inputs from the user 125. The interface 112 sends the inputs from the user 125 to the control unit 102. In one embodiment, the interface 112 is configured to communicate an output from the control unit 102 to the user 125. For example, the interface 112 includes an audio system for playing media content to the user 125 and/or a display device for displaying a level of media volume to the user 125. One having ordinary skill in the art will recognize that the interface 112 may include other types of devices for providing the functionality described herein.

The user 125 is a human user. In one embodiment, the user 125 is a driver driving a vehicle on a road. The user 125 interacts with, or otherwise provides an input to, an interface 112, which sends and receives different types of data to and from the control unit 102. For example, the interface 112 is a touch screen and the user 125 touches a portion of the touch screen with a finger or a stylus to provide an input.

The storage device 140 is a non-transitory memory that stores data. For example, the storage device 140 is a dynamic random access memory (DRAM) device, a static random access memory (SRAM) device, flash memory or some other memory device known in the art. In one embodiment, the storage device 140 also includes a non-volatile memory or similar permanent storage device and media such as a hard disk drive, a floppy disk drive, a compact disc read only memory (CD-ROM) device, a digital versatile disc read only memory (DVD-ROM) device, a digital versatile disc random access memories (DVD-RAM) device, a digital versatile disc rewritable (DVD-RW) device, a flash memory device, or some other non-volatile storage device known in the art. The storage device 140 is described below in more detail with reference to FIG. 3.

The optional network 105 is a conventional type of network, wired or wireless, and may have any number of configurations such as a star configuration, token ring configuration or other configurations known to those skilled in the art. In one embodiment, the network 105 comprises one or more of a local area network (LAN), a wide area network (WAN) (e.g., the Internet) and/or any other interconnected data path across which multiple devices communicate. In another embodiment, the network 105 is a peer-to-peer network. The network 105 is coupled to or includes portions of a telecommunications network for sending data in a variety of different communication protocols. For example, the network is a 3G network or a 4G network. In yet another embodiment, the network 105 includes Bluetooth communication networks or a cellular communications network for sending and receiving data such as via short messaging service (SMS), multimedia messaging service (MMS), hypertext transfer protocol (HTTP), direct data connection, wireless application protocol (WAP), email, etc. In yet another embodiment, all or some of the links in the network 105 are encrypted using conventional encryption technologies such as secure sockets layer (SSL), secure HTTP and/or virtual private networks (VPNs).

The optional unified cloud database 150 is an online database accessible from the network 105. For example, the unified cloud database 150 is a database where data is stored on multiple virtual servers hosted by different companies. In one embodiment, the unified cloud database 150 stores any data for providing the functionality of the system 100. In another embodiment, the unified cloud database 150 stores data received from a plurality of control units 102 embedded in a plurality of vehicles.

The system 100 provides a framework for dynamically adjusting in-vehicle media volume based at least in part on a predicted workload for a user. This dynamic adjustment of the media volume is particularly advantageous because, among other things, it automatically changes the media volume in real time based at least in part on the predicted workload without distracting a driver from driving the automobile. For example, the system 100 automatically changes the media volume based at least in part on a predicted workload value representing a predicted workload for a driver so that the driver is not distracted from the task of driving to manually adjust the media volume. Additionally, the system 100 incorporates a variety of factors such as environmental factors (e.g., weather condition, road condition, etc.) and vehicle condition factors (e.g., a velocity of a vehicle, acceleration, deceleration, a brake angle, a steering angle, etc.) into the prediction of the workload as described below, which improves accuracy for the prediction of the workload and therefore provides a better user experience for the automatic media volume control.

Volume Control Module

Figure 2:
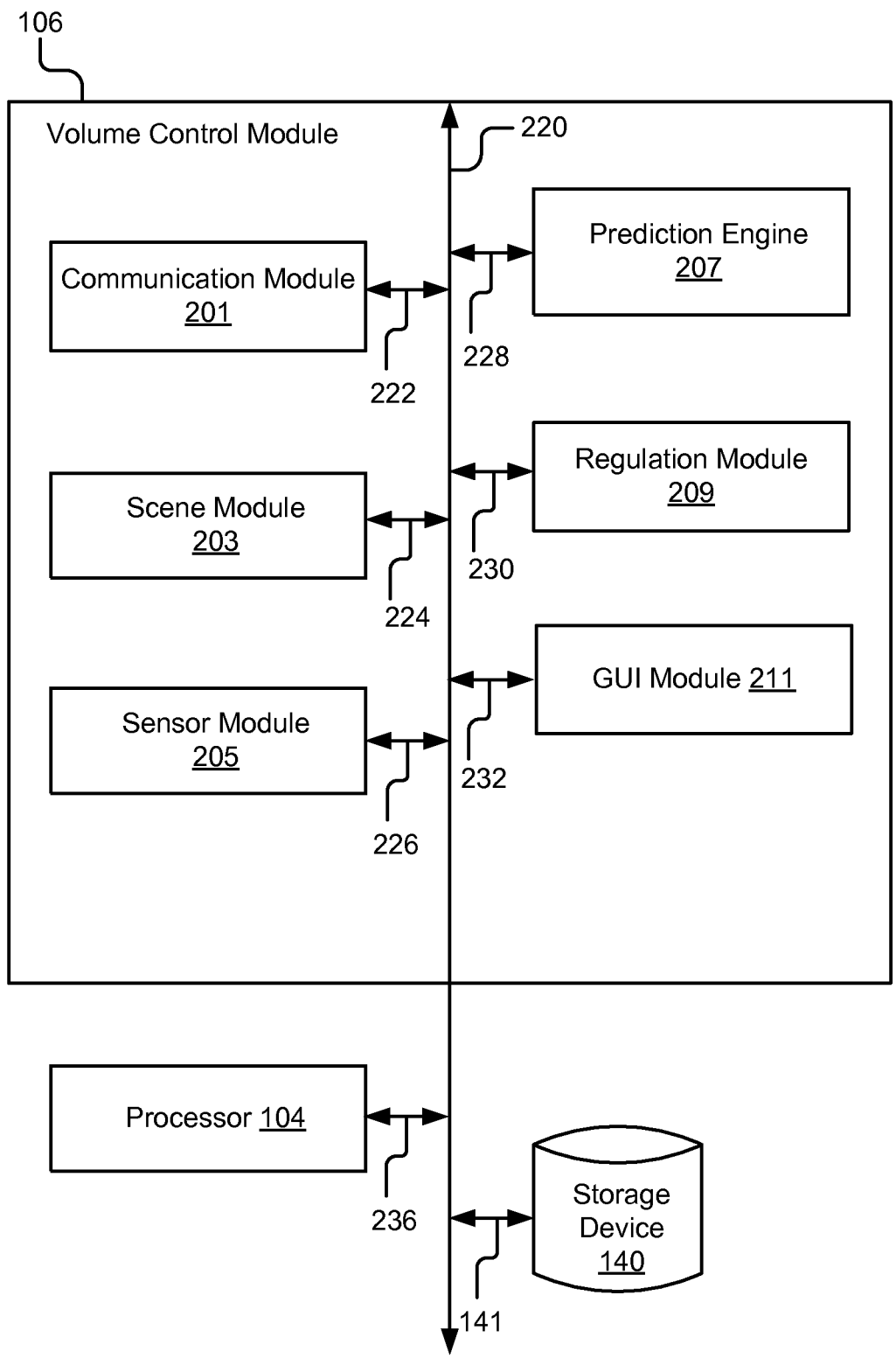
FIG. 2 is a block diagram illustrating a volume control module according to one embodiment.

Referring now to FIG. 2, the volume control module 106 is shown in more detail. FIG. 2 is a block diagram illustrating a volume control module 106 according to one embodiment. The volume control module 106 comprises a communication module 201, a scene module 203, a sensor module 205, a prediction engine 207, a regulation module 209 and a graphical user interface (GUI) module 211. These components of the volume control module 106 are communicatively coupled to a bus 220 for communication with each other. In the illustrated embodiment, the processor 104 is communicatively coupled to the bus 220 via signal line 236. The storage device 140 is communicatively coupled to the bus 220 via signal line 141.

The communication module 201 is code and routines for handling communication between components of the volume control module 106 and other components of the system 100. For example, the communication module 201 receives one or more sensor signals from one or more sensors 110 and sends the one or more sensor signals to the sensor module 205. The communication module 201 is communicatively coupled to the bus 220 via signal line 222.

In one embodiment, the communication module 201 receives one or more images from the camera 108 and sends the one or more images to the scene module 203. In another embodiment, the communication module 201 receives graphical data from the GUI module 211 and sends the graphical data to the interface 112 for displaying a user interface to a user. In yet another embodiment, the communication module 201 receives data from other components of the volume control module 106 and stores the data in the storage device 140 via the bus 220. For example, the communication module 201 receives sensor data from the sensor module 205 and stores the sensor data in the storage device 140.

In one embodiment, the communication module 201 retrieves data from the storage device 140 and sends the data to other components of the volume control module 106. For example, the communication module 201 retrieves sensor data from the storage device 140 and sends the sensor data to the prediction engine 207. In another embodiment, the communication module 201 handles internal communications between components of the volume control module 106. For example, the communication module 201 communicates with the scene module 203 and the prediction engine 207 to deliver scene category data generated by the scene module 203 to the prediction engine 207.

The scene module 203 is code and routines for generating scene category data. For example, the scene module 203 receives one or more images from the camera 108 via the communication module 201, processes the one or more images and generates scene category data associated with a scene external to a vehicle from the one or more images. In one embodiment, the one or more images are one or more successive frames from a video captured in the scene. The scene module 203 stores the one or more images as image data in the storage device 140. The scene module 203 is communicatively coupled to the bus 220 via signal line 224.

The scene category data includes data in one or more categories associated with a scene. For example, the scene category data includes one or more of the following: weather data in a weather category (e.g., sunny weather, rainy weather, cloudy weather, foggy weather, windy weather, etc.); road type data in a road category (e.g., a wide road or a narrow road, etc.); traffic data in a traffic category (e.g., congested traffic, heavily dense traffic, dense traffic, medium traffic, no traffic, traffic merging to a highway, pedestrians crossing a road, etc.); and scene type data in a scene type category (e.g., a forest scene, a suburban scene, an urban scene or a freeway scene, etc.). In one embodiment, the scene module 203 sends the scene category data to the prediction engine 207. In another embodiment, the scene module 203 stores the scene category data in the storage device 140.

In one embodiment, the scene module 203 applies image processing techniques to process the one or more images and generate the scene category data. For example, the scene module 203 considers the one or more images as two-dimensional signals and processes the one or more images using standard signal processing techniques such as signal filtering, pattern recognition, etc. In another embodiment, the scene module 203 establishes a model (e.g., a Bayesian network and/or a feed-forward neural network, etc.), applies the one or more images as inputs to the model and generates the scene category data (e.g., scene type data, weather data, etc.) as an output from the model. One skilled in the art will recognize that the scene module 203 may implement any image processing techniques to generate the scene category data from the one or more images.

The sensor module 205 is code and routines for generating sensor data. For example, the sensor module 205 receives a sensor signal from a temperature-sensitive sensor 110 (e.g., a thermostat) embedded in a vehicle, processes the sensor signal and generates sensor data describing a temperature from the sensor signal. The sensor module 205 is communicatively coupled to the bus 220 via signal line 226.

In one embodiment, the sensor module 205 receives one or more sensor signals from one or more sensors 110. For example, the sensor module 205 receives a first sensor signal from a first sensor 110 for monitoring an angle of a brake device in a vehicle, a second sensor signal from a second sensor 110 for monitoring a velocity of the vehicle and a third sensor signal from a third sensor 110 for monitoring an angle of a steering device in the vehicle, etc. The sensor module 205 generates sensor data from the one or more sensor signals. The sensor data includes one or more of brake data, velocity data, steering data, wiper data, light data and temperature data, etc. In one embodiment, the sensor module 205 sends the sensor data to the prediction engine 207. In another embodiment, the sensor module 205 stores the sensor data in the storage device 140.

The brake data is data associated with a brake device. For example, the brake data includes data describing an angle of a brake device in a vehicle. The velocity data is data describing a velocity of a vehicle. For example, the velocity data describes that a vehicle is moving at a speed of 65 miles per hour. The steering data is data associated with a steering device in a vehicle. For example, the steering data includes data describing an angle of a steering device. The wiper data is data describing a status of a windshield wiper. For example, the wiper data describes that a windshield wiper is activated. The light data is data describing a status of lights in a vehicle. For example, the light data includes data describing that low-beam headlights of a vehicle are turned on. The temperature data is data describing a temperature. For example, the temperature data indicates that it is 90° F. inside a vehicle.

The prediction engine 207 is code and routines for predicting a workload for a user. For example, the prediction engine 207 is a workload predictor that predicts a workload for a driver when driving a vehicle in a scene (e.g., a freeway scene). The prediction engine 207 is communicatively coupled to the bus 220 via signal line 228. The prediction engine 207 collects data for predicting a workload for a user. In one embodiment, the prediction engine 207 receives the scene category data from the scene module 203 and the sensor data from the sensor module 205. In another embodiment, the prediction engine 207 retrieves the scene category data and the sensor data from the storage device 140.

In one embodiment, the prediction engine 207 aggregates the scene category data and the sensor data to form a prediction feature vector. A prediction feature vector is a vector that includes a set of data used to predict a workload for a user. For example, the prediction feature vector includes the scene category data and the sensor data. The prediction feature vector is further described below with reference to FIG. 4.

In one embodiment, the prediction engine 207 predicts a workload for a user based at least in part on the scene category data and the sensor data. A workload predicted by the prediction engine 207 is referred to as "a predicted workload." For example, the prediction engine 207 retrieves model data from the storage device 140 and establishes a prediction model based at least in part on the model data. The model data is data for establishing a prediction model. A prediction model is a model used to predict a workload for a user. For example, a prediction model is a statistical model that predicts a workload for a user. The prediction engine 207 applies the scene category data and the sensor data as inputs to the prediction model and generates a predicted workload as an output from the prediction model. In another embodiment, the prediction engine 207 predicts a workload for a user based at least in part on the prediction feature vector. For example, the prediction engine 207 applies the prediction feature vector as an input to the prediction model and generates a predicted workload as an output from the prediction model.

In one embodiment, the prediction engine 207 generates a workload value that represents a workload for a user. For example, the prediction engine 207 generates a workload value indicating a predicted workload for a user as an output from a prediction model. A workload value that represents a predicted workload is referred to as "a predicted workload value." In one embodiment, the prediction engine 207 establishes a one-to-one relationship between a workload and a workload value so that a greater workload value represents a higher workload. For example, a first workload value (e.g., 0.7) greater than a second workload value (e.g., 0.4) indicates that a first workload represented by the first workload value is higher than a second workload represented by the second workload value.

In one embodiment, a workload value has a value between a minimal value such as "0" and a maximal value such as "1." A maximal workload value indicates that the prediction engine 207 predicts a maximal workload for a user. For example, when a vehicle is merging into an icy highway that has heavily dense traffic, the prediction engine 207 predicts a maximal workload for a driver driving the vehicle and generates a maximal workload value for the maximal workload to indicate that the driver is required to pay full attention to the driving task. Alternatively, a minimal workload value indicates that the prediction engine 207 predicts a minimal workload for a user. For example, when a vehicle is temporarily parked on a street, the prediction engine 207 predicts a minimal workload for a driver driving the vehicle and generates a minimal workload value for the minimal workload to indicate that the driver does not need to pay any attention to driving.

In one embodiment, the prediction engine 207 sends the workload value to the regulation module 209. In another embodiment, the prediction engine 207 stores the workload value as a portion of prediction data 307 in the storage device 140. The prediction data 307 is described below with reference to FIG. 3.

The regulation module 209 is code and routines for adjusting media volume. For example, the regulation module 209 is an audio regulator that automatically adjusts the media volume for an in-vehicle audio system. The regulation module 209 is communicatively coupled to the bus 220 via signal line 230. In one embodiment, the regulation module 209 receives a workload value representing a predicted workload from the prediction engine 207. In another embodiment, the regulation module 209 retrieves a workload value representing a predicted workload from the prediction data 307 in the storage device 140.

In one embodiment, the regulation module 209 establishes a conversion between a workload value and a level of the media volume. For example, the regulation module 209 establishes a one-to-one relationship between a workload value and a level of the media volume so that each workload value is associated with a different level of the media volume. In one embodiment, a workload value and a level of the media volume associated with the workload value have an inverse association such that a greater workload value is associated with a smaller level of the media volume. For example, a minimal workload value is associated with a maximal level of the media volume and a maximal workload value is associated with a minimal level of the media volume. The rationale to implement the inverse association between a workload value and a level of the media volume is that a greater workload value indicates a higher workload for a user. Under the circumstances of a higher workload that requires the user to focus on the driving task, decreasing the media volume to a smaller level is one example approach towards reducing distractions for the user.

In one embodiment, the inverse association between a workload value and a level of the media volume is determined by a user. In another embodiment, the inverse association between a workload value and a level of the media volume is set by an administrator of the system 100.

In one embodiment, the regulation module 209 receives a predicted workload value and determines a level of the media volume associated with the predicted workload value based at least in part on the conversion described above. A level of the media volume associated with a predicted workload value is referred to as "a predicted level of the media volume." In another embodiment, the regulation module 209 determines a level of the media volume in which the media content is being played currently. A level of the media volume in which the media content is being played currently is referred to as "a current level of the media volume." For example, the regulation module 209 checks a setting for an in-vehicle audio system and obtains a current level of the media volume from the setting. The regulation module 209 determines a workload value associated with the current level of the media volume based at least in part on the conversion described above. A workload value associated with the current level of the media volume is referred to as "a current workload value." A current workload value represents a current workload that is, for example, a workload required to drive a vehicle currently in an environment.

In one embodiment, the regulation module 209 adjusts the media volume based at least in part on the predicted workload value. For example, the regulation module 209 compares the predicted workload value to the current workload value. If the predicted workload value is greater than the current workload value indicating that the predicted workload is greater than the current workload, the regulation module 209 decreases the media volume from the current level to the predicted level to reduce distractions for the user. If the predicted workload value is smaller than the current workload value indicating that the predicted workload is smaller than the current workload, the regulation module 209 increases the media volume from the current level to the predicted level. If the predicted workload value is equal to the current workload value indicating that the predicted workload is equal to the current workload, the regulation module 209 does not change the media volume.

In one embodiment, the regulation module 209 sends a voice message to notify the user that the media volume is changed. In another embodiment, the regulation module 209 instructs the GUI module 211 to generate a user interface for notifying the user that the media volume is changed.

The GUI module 211 is code and routines for generating graphical data for providing a user interface to a user. The GUI module 211 is communicatively coupled to the bus 220 via signal line 232. In one embodiment, the GUI module 211 generates graphical data for depicting a user interface to notify a user that the media volume is adjusted. In another embodiment, the GUI module 211 generates graphical data for depicting a user interface to deliver other messages (e.g., music recommendations) to a user. In other embodiments, the GUI module 211 generates graphical data for depicting a user interface via which a user inputs information to the system 100. The GUI module 211 sends the generated graphical data to the interface 112, causing the interface 112 to present the user interface to the user.

Storage Device

Figure 3:
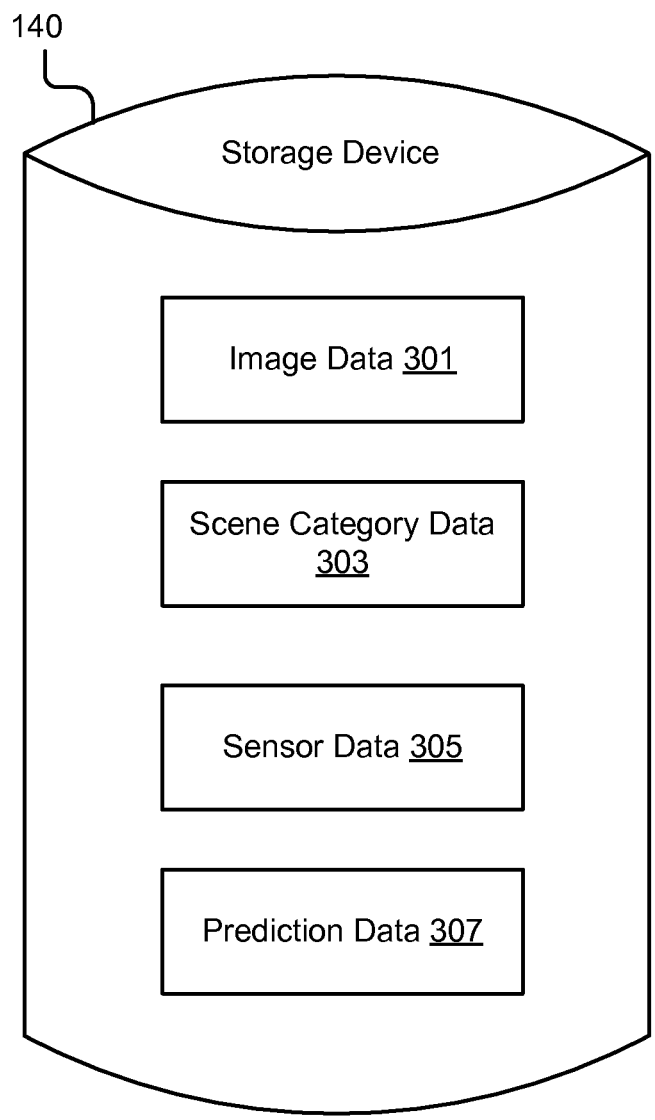
FIG. 3 is a block diagram illustrating a storage device according to one embodiment.

FIG. 3 is a block diagram illustrating a storage device 140 according to one embodiment. The storage device 140 includes image data 301, scene category data 303, sensor data 305 and prediction data 307. One skilled in the art will recognize that the storage device 140 may include other data for providing the functionality described herein.

The image data 301 is data describing one or more images. In one embodiment, the scene module 203 receives one or more images from the camera 108 via the communication module 201 and stores the one or more images as a portion of the image data 301 in the storage device 140.

The scene category data 303 includes data describing one or more environmental factors associated with a workload for a user. For example, the scene category data 303 includes one or more of weather data, road type data, traffic data and scene type data, etc., that affect a workload for a driver when the driver is driving a vehicle in an environment.

The sensor data 305 includes data generated by the sensor module 205. For example, the sensor data 305 includes one or more of brake data, velocity data, steering data, wiper data, light data and temperature data, etc.

The prediction data 307 is data associated with the prediction of a workload. For example, the prediction data 307 includes model data for establishing a prediction model to predict a workload. In one embodiment, the prediction data 307 includes one or more prediction feature vectors that are used to generate one or more predicted workloads. In another embodiment, the prediction engine 307 includes one or more workload values for the one or more predicted workloads.

Prediction Feature Vector

Figure 4:
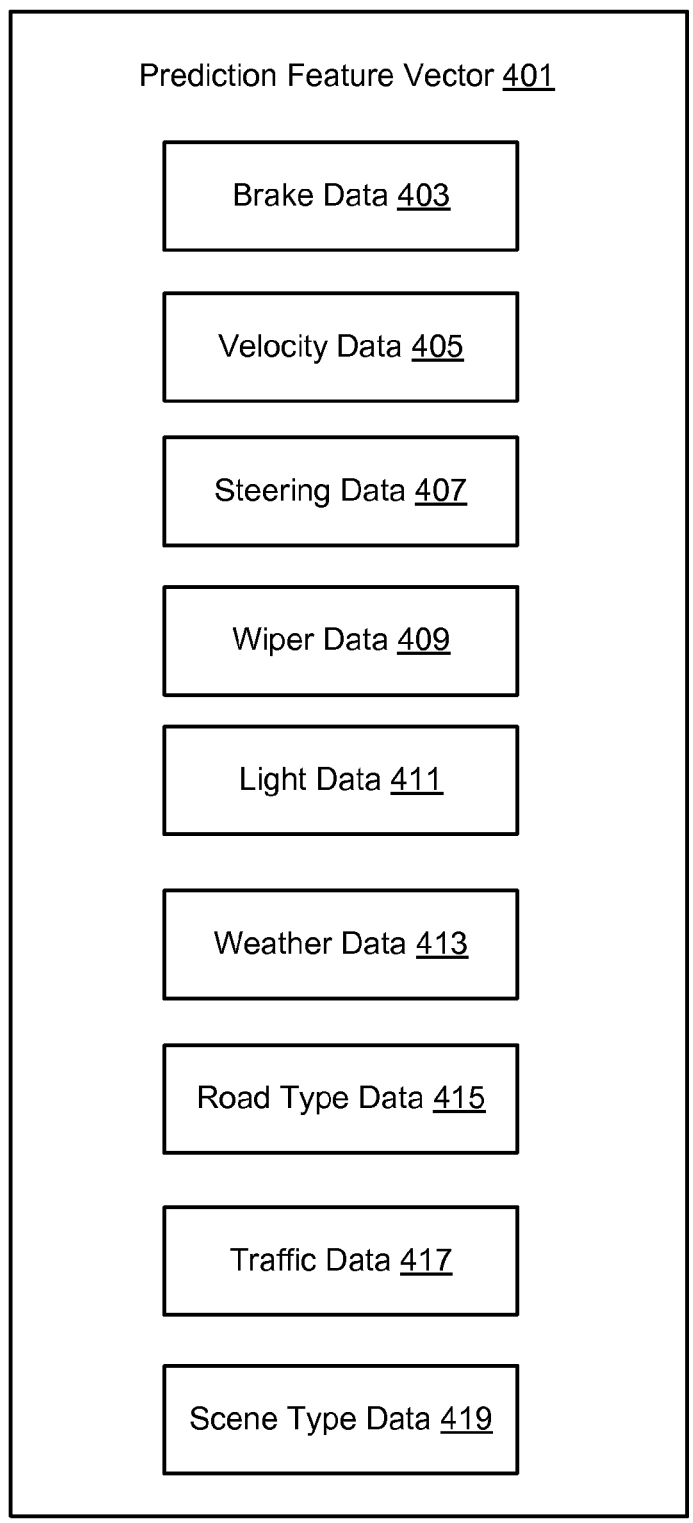
FIG. 4 is a block diagram illustrating a prediction feature vector according to one embodiment.

FIG. 4 is a block diagram illustrating a prediction feature vector 401 according to one embodiment. In the illustrated embodiment, the prediction feature vector 401 includes sensor data such as brake data 403, velocity data 405, steering data 407, wiper data 409 and light data 411. The prediction feature vector 401 further includes scene category data such as weather data 413, road type data 415, traffic data 417 and scene type data 419. It will be obvious to one skilled in the art that the prediction feature vector 401 may additionally include other sensor data (e.g., temperature data) and other scene category data (e.g., a timestamp indicating whether it is daytime or nighttime in an environment).

The brake data 403 includes data describing an angle of a brake device in a vehicle. For example, the brake data 403 having a value of zero degrees indicates that the brake device is not pressed by a driver.

The velocity data 405 includes data describing a velocity of a vehicle. For example, the velocity data 405 indicates that the vehicle is moving at a speed of 30 miles per hour.

The steering data 407 includes data describing an angle of a steering device in a vehicle. For example, the steering data 407 having a value of zero degrees indicates that the vehicle is moving straightforward.

The wiper data 409 includes data describing a status of a windshield wiper. For example, the wiper data 409 having a value of one indicates that the windshield wiper is activated. Alternatively, the wiper data 409 having a value of zero indicates that the windshield wiper is not activated.

The light data 411 includes data describing a status of lights in a vehicle. For example, the light data 411 having a value of zero indicates that no light is turned on, while the light data 411 having a value of one indicates that low-beam headlights are turned on. One skilled in the art will recognize that the light data 411 may have other values to indicate that other lights such as high-beam lights are turned on.

The weather data 413 is data describing a weather condition in an environment. A weather condition is one of sunny weather, rainy weather, cloudy weather, foggy weather, windy weather and undetermined weather, etc. For example, the weather data 413 having a value of one indicates that the weather condition is sunny, while the weather data 413 having a value of two indicates that the weather condition is rainy.

The road type data 415 is data describing a condition for a road. For example, the road type data 415 having a value of zero indicates that the road is narrow, while the road type data 415 having a value of one indicates that the road is wide.

The traffic data 417 is data describing a traffic condition on a road. For example, the traffic data 417 includes data describing one of congested traffic, heavily dense traffic, dense traffic, medium traffic and no traffic on a road. In one embodiment, the traffic data 417 also includes other data describing other traffic conditions such as merging to a highway, exiting from a highway and pedestrians crossing a road, etc.

The scene type data 419 is data describing a type of a scene. For example, the scene type data 419 includes data describing that the scene is one of a forest scene, a suburban scene, an urban scene and a freeway scene, etc.

Methods

Figure 5:
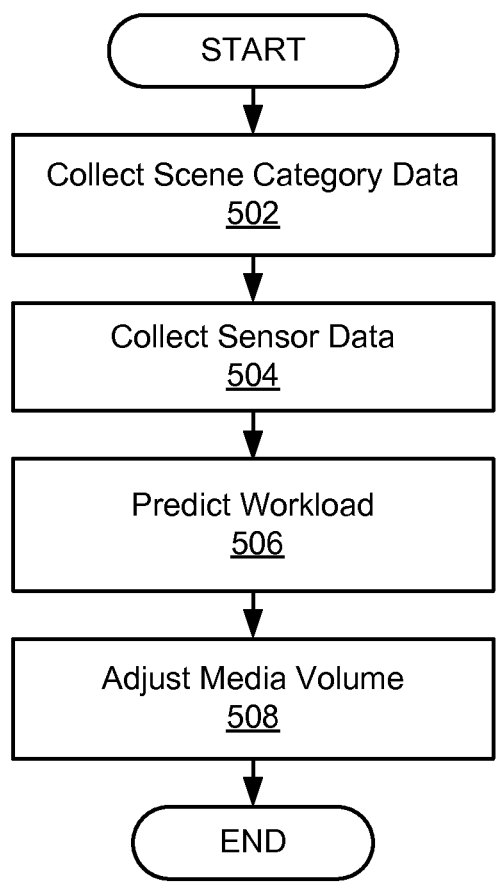
FIG. 5 is a flowchart illustrating a method for regulating media volume according to one embodiment.
Figure 6A:
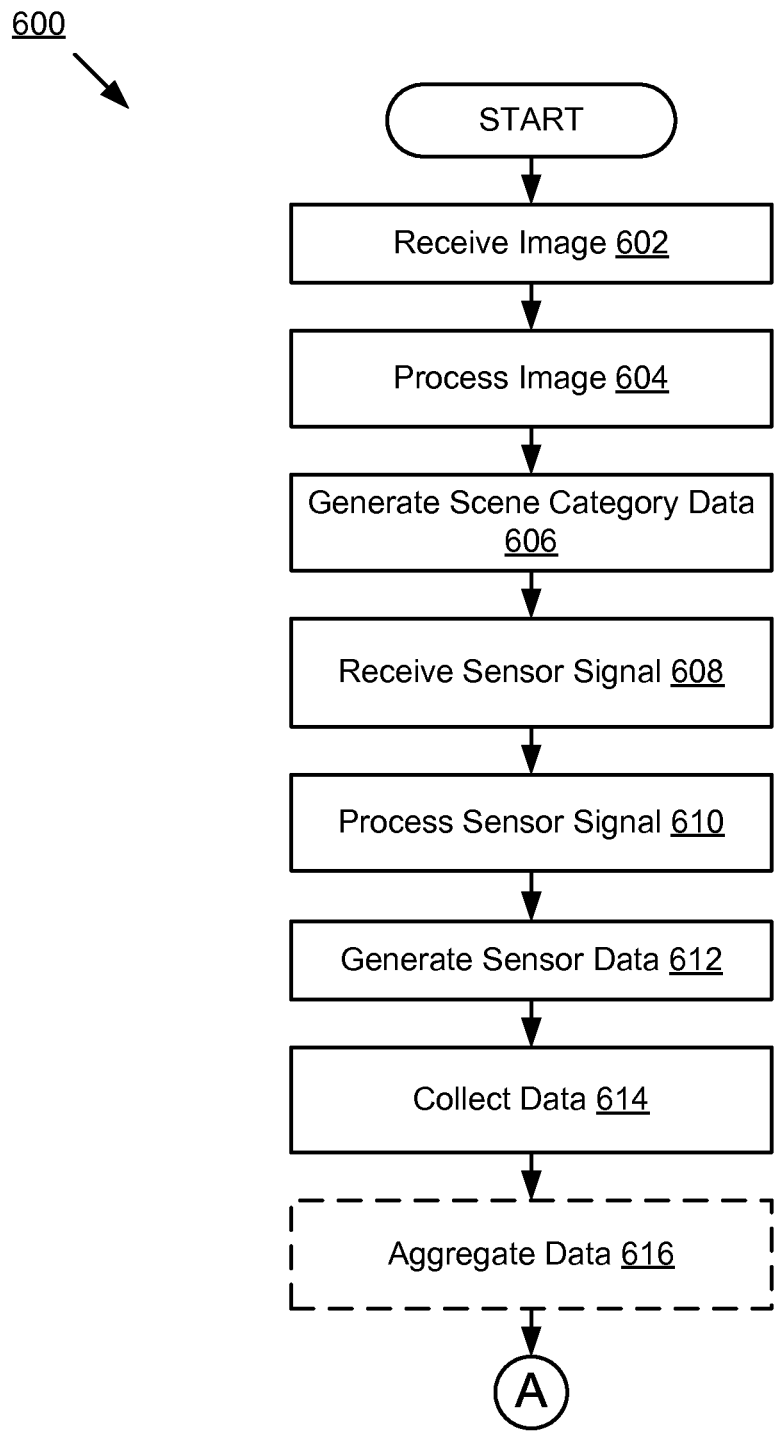
FIGS. 6A and 6B are flowcharts illustrating a method for regulating media volume according to another embodiment.
Figure 6B:
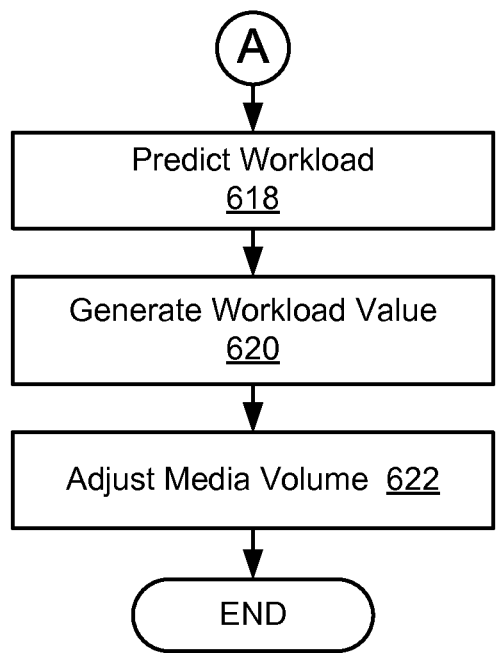

Referring now to FIGS. 5-6B, various embodiments of the method of the specification will be described. FIG. 5 is a flowchart illustrating a method 500 for adjusting in-vehicle media volume according to one embodiment. The prediction engine 207 collects 502 scene category data. The scene category data includes one or more of weather data, road type data, traffic data and scene type data, etc. In one embodiment, the prediction engine 207 receives the scene category data from the scene module 203. In another embodiment, the prediction engine 207 retrieves the scene category data from the storage device 140. The prediction engine 207 collects 504 sensor data. The sensor data includes one or more of brake data, velocity data, steering data, wiper data, light data and temperature data, etc. In one embodiment, the prediction engine 207 receives the sensor data from the sensor module 205. In another embodiment, the prediction engine 207 retrieves the sensor data from the storage device 140.

The prediction engine 207 predicts 506 a workload for a user. For example, the prediction engine 207 predicts a workload for a user based at least in part on the scene category data and the sensor data. The prediction engine 207 generates a predicted workload value for the predicted workload and sends the predicted workload value to the regulation module 209.

The regulation module 209 adjusts 508 the media volume based at least in part on the predicted workload value. For example, the regulation module 209 determines a current level of the media volume in which the media content is being played. The regulation module 209 determines a current workload value associated with the current level of the media volume. The regulation module 209 also determines a predicted level of the media volume associated with the predicted workload value. The regulation module 209 compares the current workload value to the predicted workload value. If the predicted workload value is greater than the current workload value indicating that the predicted workload is higher than the current workload, the regulation module 209 decreases the media volume from the current level to the predicted level. If the predicted workload value is smaller than the current workload value indicating that the predicted workload is lower than the current workload, the regulation module 209 increases the media volume from the current level to the predicted level. If the predicted workload value is equal to the current workload value, the regulation module 209 does not change the media volume.

FIGS. 6A and 6B are flowcharts illustrating a method 600 for adjusting in-vehicle media volume according to another embodiment. Referring now to FIG. 6A, the communication module 201 receives 602 one or more images from a camera 108. In one embodiment, the one or more images are one or more frames from a video captured by the camera 108. The communication module 201 sends the one or more images to the scene module 203. The scene module 203 processes 604 the one or more images and generates 606 scene category data based at least in part on the one or more images. For example, the scene module 203 applies image processing techniques (e.g., filtering, pattern recognition, etc.) to the one or more images and generates the scene category data as an output from the image processing. The scene category data includes one or more of weather data, road type data, traffic data and scene type data, etc. In one embodiment, the scene module 203 sends the scene category data to the prediction engine 207. In another embodiment, the scene module 203 stores the scene category data in the storage device 140.

The communication module 201 receives 608 one or more sensor signals from one or more sensors 110 and sends the one or more sensor signals to the sensor module 205. The sensor module 205 processes 610 the one or more sensor signals and generates 612 sensor data from the one or more sensor signals. The sensor data includes one or more of brake data, velocity data, steering data, wiper data, light data and temperature data, etc. In one embodiment, the sensor module 205 sends the sensor data to the prediction engine 207. In another embodiment, the sensor module 205 stores the sensor data in the storage device 140.

The prediction engine 207 collects 614 data for predicting a workload for a user. For example, the prediction engine 207 collects the scene category data and the sensor data for predicting a workload for a user. In one embodiment, the prediction engine 207 receives the scene category data from the scene module 203 and the sensor data from the sensor module 205. In another embodiment, the prediction engine 207 retrieves the scene category data and the sensor data from the storage device 140. The prediction engine 207 aggregates 616 the collected data to form a prediction feature vector. For example, the prediction engine 207 aggregates the scene category data and the sensor data to form a prediction feature vector. Step 616 is depicted using a dashed line to indicate that it is an optional feature of the method 600.

Referring now to FIG. 6B, the prediction engine 207 predicts 618 a workload for a user. For example, the prediction engine 207 predicts a workload for a user based at least in part on the scene category data and the sensor data. In one embodiment, the prediction engine 207 predicts a workload for a user based at least in part on the prediction feature vector. The prediction engine 207 generates 620 a predicted workload value for the predicted workload and sends the predicted workload value to the regulation module 209.

The regulation module 209 adjusts 622 the media volume based at least in part on the predicted workload value. For example, the regulation module 209 determines a current level of the media volume in which the media content is being played. The regulation module 209 determines a current workload value associated with the current level of the media volume. The regulation module 209 also determines a predicted level of the media volume associated with the predicted workload value. The regulation module 209 compares the current workload value to the predicted workload value. If the predicted workload value is greater than the current workload value indicating that the predicted workload is higher than the current workload, the regulation module 209 decreases the media volume to the predicted level. If the predicted workload value is smaller than the current workload value indicating that the predicted workload is lower than the current workload, the regulation module 209 increases the media volume to the predicted level. If the predicted workload value is equal to the current workload value, the regulation module 209 does not change the media volume.

The foregoing description of the embodiments has been presented for the purposes of illustration and description. It is not intended to be exhaustive or to limit the specification to the precise form disclosed. Many modifications and variations are possible in light of the above teaching. It is intended that the scope of the embodiments be limited not by this detailed description, but rather by the claims of this application. As will be understood by those familiar with the art, the examples may be embodied in other specific forms without departing from the spirit or essential characteristics thereof. Likewise, the particular naming and division of the modules, routines, features, attributes, methodologies and other aspects are not mandatory or significant, and the mechanisms that implement the description or its features may have different names, divisions and/or formats. Furthermore, as will be apparent to one of ordinary skill in the relevant art, the modules, routines, features, attributes, methodologies and other aspects of the specification can be implemented as software, hardware, firmware or any combination of the three. Also, wherever a component, an example of which is a module, of the specification is implemented as software, the component can be implemented as a standalone program, as part of a larger program, as a plurality of separate programs, as a statically or dynamically linked library, as a kernel loadable module, as a device driver, and/or in every and any other way known now or in the future to those of ordinary skill in the art of computer programming. Additionally, the specification is in no way limited to implementation in any specific programming language, or for any specific operating system or environment. Accordingly, the disclosure is intended to be illustrative, but not limiting, of the scope of the specification, which is set forth in the following claims.

What is claimed is:

1. A computer-implemented method for regulating media volume, the method comprising:
    collecting sensor data measuring one or more operational conditions related to a vehicle;
    capturing one or more images of an operating environment external to the vehicle;
    generating scene category data from the one or more images that classifies the operating environment using one or more scene categories, the one or more scene categories including a weather condition and an overall scene type;
    predicting a workload for a user based at least in part on the scene category data and the sensor data;
    generating a predicted workload value for the predicted workload; and
    adjusting the media volume based at least in part on the predicted workload value.

2. The method of claim 1, wherein predicting the workload for the user further comprises:
    aggregating the scene category data and the sensor data to form a prediction feature vector, the prediction feature vector including one or more of brake data, velocity data, steering data, wiper data, light data, and temperature data, the prediction feature vector further including a combination of (1) one or more of weather data and scene type data and (2) one or more of traffic data and road type data; and
    predicting the workload for the user based at least in part on the prediction feature vector.

3. The method of claim 1 further comprising:
    receiving one or more sensor signals from one or more sensors; and
    generating the sensor data based at least in part on the one or more sensor signals.

4. The method of claim 1, wherein the scene category data further classifies the operating environment using at least (1) one or more of the weather condition and the overall scene type and (2) one or more of a road type and a traffic condition.

5. The method of claim 1, wherein the scene category data includes one or more of weather data, road type data, traffic data and scene type data.

6. The method of claim 1, wherein the sensor data includes one or more of brake data, velocity data, steering data, wiper data, light data and temperature data.

7. The method of claim 1, wherein adjusting the media volume further comprises:
    determining a current level of the media volume in which media content is being played;
    determining a current workload value associated with the current level of the media volume;
    determining a predicted level of the media volume associated with the predicted workload value;
    comparing the predicted workload value to the current workload value; and
    decreasing the media volume from the current level to the predicted level if the predicted workload value is greater than the current workload value.

8. A system for regulating media volume, the system comprising:
    a prediction engine collecting sensor data and scene category data, the sensor data measuring one or more operational conditions related to a vehicle, the scene category data generated from one or more images of an operating environment external to the vehicle and classifying the operating environment using one or more scene categories, the one or more scene categories including a weather condition and an overall scene type, the prediction engine predicting a workload for a user based at least in part on the scene category data and the sensor data, the prediction engine generating a predicted workload value for the predicted workload; and
    a regulation module communicatively coupled to the prediction engine, the regulation module adjusting the media volume based at least in part on the predicted workload value.

9. The system of claim 8, wherein the prediction engine is further configured to:
    aggregate the scene category data and the sensor data to form a prediction feature vector, the prediction feature vector including one or more of brake data, velocity data, steering data, wiper data, light data, and temperature data, the prediction feature vector further including a combination of (1) one or more of weather data and scene type data and (2) one or more of traffic data and road type data; and
    predict the workload for the user based at least in part on the prediction feature vector.

10. The system of claim 8 further comprising:
    a communication module receiving one or more sensor signals from one or more sensors; and a sensor module communicatively coupled to the communication module and the prediction engine, the sensor module generating the sensor data based at least in part on the one or more sensor signals, the sensor module sending the sensor data to the prediction engine.

11. The system of claim 8 further comprising:
a communication module receiving one or more images from a camera; and
a scene module communicatively coupled to the communication module and the prediction engine, the scene module processing the one or more images to generate the scene category data, the scene module sending the scene category data to the prediction engine.

12. The system of claim 8, wherein the scene category data further classifies the operating environment using at least (1) one or more of the weather condition and the overall scene type and (2) one or more of a road type and a traffic condition.

13. The system of claim 8, wherein the sensor data includes one or more of brake data, velocity data, steering data, wiper data, light data, and temperature data.

14. The system of claim 8, wherein the regulation module is further configured to:
determine a current level of the media volume in which media content is being played;
determine a current workload value associated with the current level of the media volume;
determine a predicted level of the media volume associated with the predicted workload value;
compare the predicted workload value to the current workload value; and
decrease the media volume from the current level to the predicted level if the predicted workload value is greater than the current workload value.

15. A computer program product comprising a non-transitory computer readable medium encoding instructions that, in response to execution by a computing device, cause the computing device to perform operations comprising:
collecting sensor data measuring one or more operational conditions related to a vehicle;
capturing one or more images of an operating environment external to the vehicle;
generating scene category data from the one or more images that classifies the operating environment using one or more scene categories, the one or more scene categories including a weather condition and an overall scene type;
predicting a workload for a user based at least in part on the scene category data and the sensor data;
generating a predicted workload value for the predicted workload; and
adjusting the media volume based at least in part on the predicted workload value.

16. The computer program product of claim 15, wherein predicting the workload for the user further comprises:
aggregating the scene category data and the sensor data to form a prediction feature vector, the prediction feature vector including one or more of brake data, velocity data, steering data, wiper data, light data, and temperature data, the prediction feature vector further including a combination of (1) one or more of weather data and scene type data and (2) one or more of traffic data and road type data; and
predicting the workload for the user based at least in part on the prediction feature vector.

17. The computer program product of claim 15, wherein the instructions encoded in the computer readable medium when executed cause the computing device to perform operations further comprising:
receiving one or more sensor signals from one or more sensors; and
generating the sensor data based at least in part on the one or more sensor signals.

18. The computer program product of claim 15, wherein the scene category data further classifies the operating environment using at least (1) one or more of the weather condition and the overall scene type and (2) one or more of a road type and a traffic condition.

19. The computer program product of claim 15, wherein the scene category data includes one or more of weather data, road type data, traffic data and scene type data.

20. The computer program product of claim 15, wherein the sensor data includes one or more of brake data, velocity data, steering data, wiper data, light data and temperature data.

* * * * *